United States Patent [19]
Lin et al.

[11] Patent Number: 5,280,193
[45] Date of Patent: Jan. 18, 1994

[54] REPAIRABLE SEMICONDUCTOR MULTI-PACKAGE MODULE HAVING INDIVIDUALIZED PACKAGE BODIES ON A PC BOARD SUBSTRATE

[76] Inventors: Paul T. Lin, 6411 Cerro Cove, Austin, Tex. 78731; James W. Sloan, 712 Laurel Valley Rd., Austin, Tex. 78746

[21] Appl. No.: 877,930

[22] Filed: May 4, 1992

[51] Int. Cl.⁵ ............... H01L 23/16; H01L 23/28; H01L 23/02; H01L 23/12
[52] U.S. Cl. .................. 257/723; 257/724; 257/685; 257/698
[58] Field of Search ............ 357/75, 80, 74, 72; 257/723, 724, 787, 698, 672, 669, 693, 685, 686

[56] References Cited

U.S. PATENT DOCUMENTS

| | | | |
|---|---|---|---|
| 4,672,421 | 6/1987 | Lin | 257/672 |
| 4,677,528 | 6/1987 | Miniet | 361/398 |
| 4,682,207 | 7/1987 | Akasaki et al. | 357/74 |
| 4,992,849 | 2/1991 | Corbett et al. | 257/669 |
| 4,996,587 | 2/1991 | Hinrichsmeyer et al. | 357/75 |
| 5,061,990 | 10/1991 | Arakawa et al. | 357/75 |
| 5,130,780 | 7/1992 | Kumai et al. | 357/75 |
| 5,191,404 | 3/1993 | Wu et al. | 257/724 |

FOREIGN PATENT DOCUMENTS

| | | | |
|---|---|---|---|
| 2571547 | 4/1986 | France | 357/75 |
| 60-194548 | 10/1985 | Japan | 357/75 |
| 61-75558 | 4/1986 | Japan | 357/75 |
| 2-135744 | 5/1990 | Japan | 357/75 |
| 3-187253 | 8/1991 | Japan | 357/75 |

*Primary Examiner*—Sheila V. Clark
*Attorney, Agent, or Firm*—Minh-Hien N. Clark

[57] ABSTRACT

A semiconductor multiple package module (10) on a PCB material substrate (18) is provided, wherein semiconductor dice are directly mounted onto the PCB material substrate (18) thereby eliminating a subsequent board mounting at the customer level. A plurality of semiconductor dice are mounted and electrically connected to a plurality of circuit traces (22) on the PCB material substrate (18) having a plurality of edge connectors (20). The plurality of circuit traces (22) has conductive paths to electrically interconnect the semiconductor dice to the edge connectors (20) and to each other. The semiconductor dice are directly overmolded on the PCB material substrate (18) with a molding compound to form individual semiconductor devices (12, 14, and 16) having separate package bodies. The individualized package bodies enable repair to the module by making removal of only nonfunctional semiconductor devices from the PCB material substrate (18) possible.

5 Claims, 2 Drawing Sheets

REPAIRABLE SEMICONDUCTOR MULTI-PACKAGE MODULE HAVING INDIVIDUALIZED PACKAGE BODIES ON A PC BOARD SUBSTRATE

FIELD OF THE INVENTION

The present invention relates to semiconductor multiple package modules in general, and more specifically to the connection of multiple semiconductor dice onto a printed circuit board material substrate in which the substrate functions both as a leadframe connection for the semiconductor dice and as a printed circuit board.

BACKGROUND OF THE INVENTION

Printed circuit (PC) boards, like everything else in electronics, are getting smaller and denser. A compact packaging technology is needed when mounting area is limited dictating that circuit elements be closely spaced. A module consisting of a plurality of semiconductor devices is used to densely dispose semiconductor devices and to obtain a small-sized electronic apparatus. PC boards have typically been designed so that semiconductor devices in the form of packaged semiconductor dice are mounted thereon to make a final circuit. Mounting can be accomplished by a surface mount technique or by socketing. Interconnections among devices arrayed on PC boards are usually made by conductive traces formed by photolithography and etching processes.

Additionally, semiconductor dice are traditionally probed individually before assembly, while critical units are burned in under accelerated aging conditions to minimize the risk of subsequent system failure. Burn-in is performed to screen out weak devices, and packaged devices rather than bare chips are normally burned-in. In a multiple chip module, the burn-in process should be performed at the packaged module level. The drawback in module level burn-in is that a percentage of die in the module will fail, and replacement with another good die has to be performed by a proper removing procedure. The replacement procedure may not always be cost effective or easy to effect.

One circuit board mounted array of semiconductor devices of particular interest is the single in-line memory module (SIMM) or a memory card. SIMM boards or memory cards are circuit arrays which are typically byte multiples of memory chips arranged on a daughter PC board or comparable mounting arrangement. The SIMM board or memory card is connected to a circuit control board by an edge connector. One edge of a SIMM module is a card edge connector, which plugs into a socket on the computer which is directly connected to the computer busses required for powering and addressing the memory on the SIMM. The semiconductor devices on SIMM boards are typically packaged in small outline J-leaded packages (SOJs) or thin small outline packages (TSOPs) before they are mounted on the daughter PC board.

Single in-line packages (SIPs) are similar in design to SIMMs, except that instead of having a card edge-type connector, SIPs have pins which are either socket mounted or solder mounted to a mother board or bus. These modules have been constructed by first packaging individual semiconductor dice into packages, and then soldering the packaged dice onto a daughter PC board. These packages are attached to the daughter board by surface mount techniques or into throughholes.

The disadvantage to both SIMMs and SIPS is that the semiconductor dice have to be packaged individually before they are mounted on a daughter board. Furthermore, each device is tested and burned-in on a discrete unit level instead of a module level.

Several methods exist for fabricating a semiconductor module. One such method uses a cofired ceramic substrate, onto which bare semiconductor dice are directly attached to the ceramic mounting surface and are wire bonded to conductive areas on the mounting surface, or are inverted and connected directly to metallized areas on the ceramic mounting surface by, for example, a solder-bump technique. However, direct chip attach has a limitation of no burn-in capability before module assembly and is difficult to repair after board mounting.

Another method of fabricating a semiconductor module involves tape automated bonded (TAB) semiconductor dice to a flexible circuit leadframe, which also serves as a printed circuit board. The semiconductor dice are tested as discrete units before being mounted, or they can be tested in the final circuit form after the TAB process. After testing and reworking, the flexible circuit leadframe is encapsulated. The dice and circuitry on the leadframe including the leadframe are encapsulated in a mold forming a single package body for the entire module. The disadvantage to this approach is that repair of the module after encapsulation is not possible. Hence, any failure of a semiconductor die inside the encapsulated module would cause the entire module to be rejected.

SUMMARY OF THE INVENTION

In accordance with the invention, there is provided a semiconductor multi-package module having a first printed circuit (PC) board material substrate, a plurality of semiconductor dice, and an encapsulating material. The first PC board material substrate has a plurality of conductive paths including bonding pads and a plurality of edge connectors. The plurality of semiconductor dice are directly mounted to the first PC board material substrate, wherein the plurality of semiconductor dice are electrically interconnected by wire bonds to the bonding pads of the plurality of conductive paths. Furthermore, the encapsulating material overmolds the plurality of semiconductor dice including the wire bonds on the first PC board material substrate, wherein the encapsulating material adheres to the PC board material substrate and forms an individualized package body for each of the plurality of semiconductor dice. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
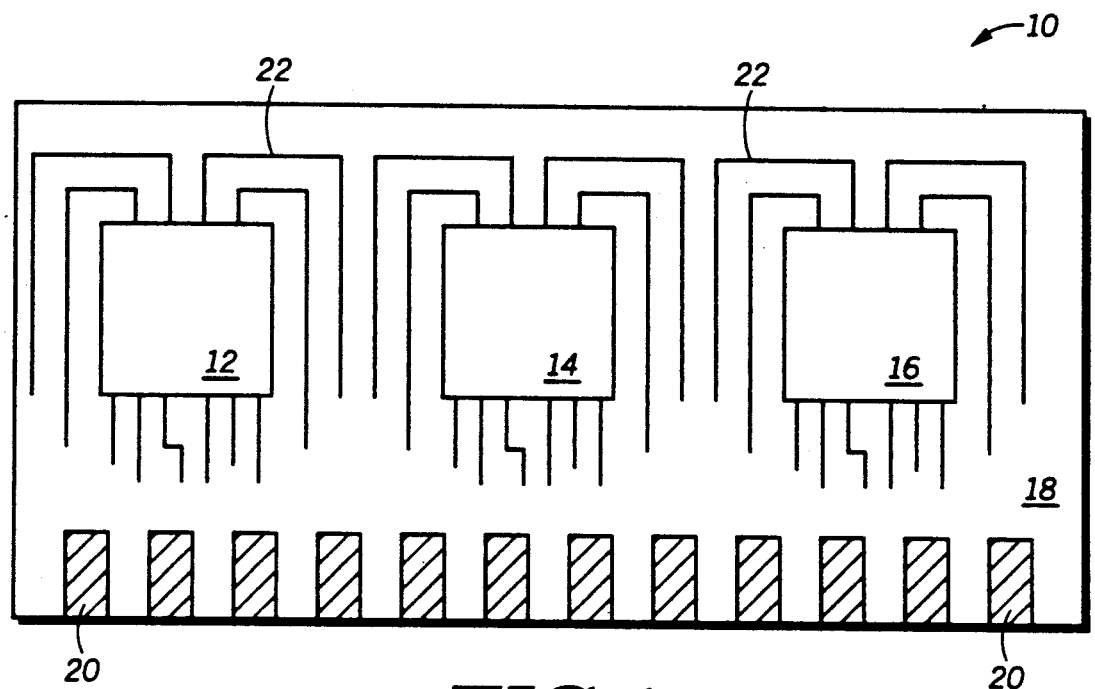
FIG. 1 is a top view of a multi-package module on a printed circuit (PC) board material substrate with edge connectors, according to a preferred embodiment of the present invention.

The invention will now be described in detail with reference to the FIGURES. Illustrated in FIG. 1 is a top view of a finished semiconductor multi-package module 10 according to a preferred embodiment of the present invention, comprising a plurality of semiconductor devices 12, 14, and 16 directly mounted on a printed circuit (PC) board material substrate 18 having a plurality of edge connectors 20 for inserting into a socket (not shown). Semiconductor devices 12, 14, and 16 are directly overmolded on the PC board material substrate 18 with a molding compound, for example, an epoxy resin-based molding compound. An overmolded semiconductor device is one where the encapsulating material or molding compound forms a package body only on one side of the supporting substrate for the semiconductor die. The PC board material substrate 18 is of a standard construction. It can be, for example, the same material and thickness as that which has previously been used for daughter boards. Additionally, edge connectors 20 are typically copper plated with solder or a metal alloy. Moreover, PC board material substrate 18 has circuit traces 22 with bonding pads enabling direct attachment and wire bonding of the semiconductor dice (not shown) inside each semiconductor device 12, 14, and 16 to substrate 18, wherein circuit traces 22 include a plurality of conductive paths (not fully shown) which connects the plurality of semiconductor devices 12, 14, and 16 to edge connectors 20 and to each other. Electrical interconnections between semiconductor devices can vary per the function of the semiconductor module, for example, a SIMM board or a memory card. Techniques for making these conductive paths and interconnections are well known in the art.

Figure 2:
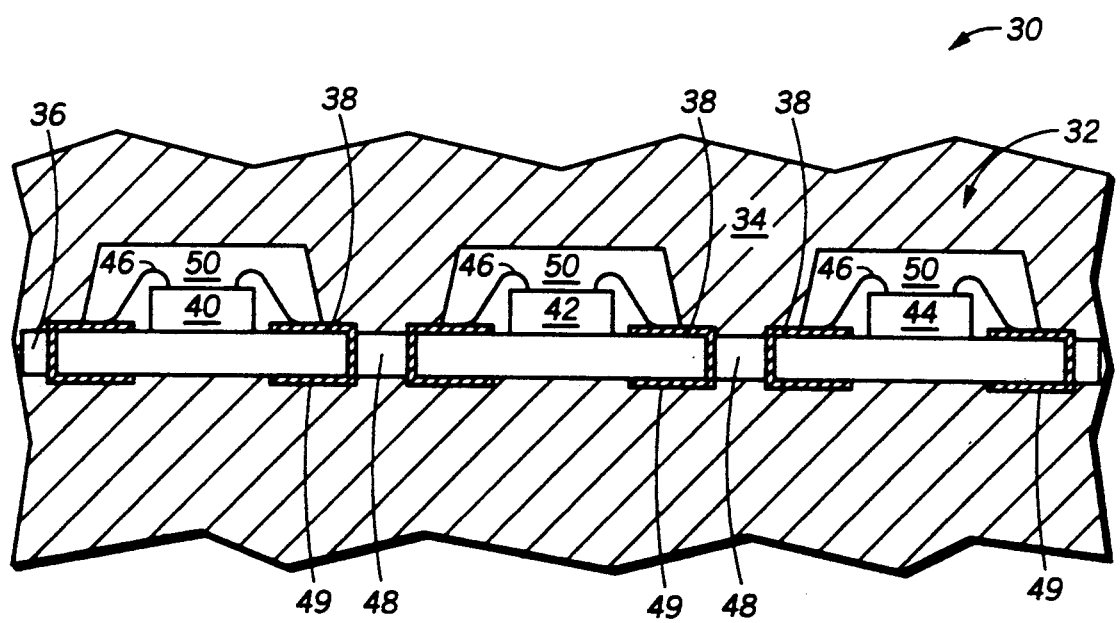
FIG. 2 is a cross-sectional view of a PC board material substrate having a plurality of semiconductor dice mounted and wire bonded thereon, the substrate assembly being inside a mold tool, in accordance with a method for making the multi-package module of FIG. 1.

Also in accordance with the invention is a method for manufacturing and repairing the semiconductor multi-package module 10 of FIG. 1. Referring to FIG. 2, a cross-section 30 of a PC board material substrate assembly 32 inside a mold tool 34 is illustrated. The PC board material substrate assembly 32 comprises a PC board material substrate 36 having a plurality of circuit traces 38 extending to the backside of the substrate 36 and a plurality of semiconductor dice 40, 42, and 44 mounted on PC board material substrate 36 and wire bonded thereto with a plurality of wire bonds 46. Semiconductor dice 40, 42, and 44 are directly mounted on PC board material substrate 36 and can be affixed thereto with a conventional die-attach epoxy. The semiconductor dice 40, 42, and 44 are electrically connected to the PC board material substrate 36 with wire bonds 46. Wire bonds 46 are of a conductive material such as gold, copper, aluminum, or alloys of these materials. Furthermore, the PC board material substrate 36 has a plurality of through-hole vias 48. Additionally, the backside metallization 49 allows the method of repair to be effected.

FIG. 2 also illustrates a mold tool 34 having a plurality of die cavities 50 into which molding compound is injected to form package bodies. The semiconductor dice 40, 42, and 44 along with their respective wire bonds 46 are overmolded in mold tool 34 wherein an individualized package body is formed for each semiconductor die. Overmolding can be done progressively for each semiconductor die, or it can be accomplished in one step, depending on the size of the mold tool and its design. For this overmolding operation, the PC board material substrate 36 is analogous to a leadframe in a conventional molding process because the leadframe is the supporting substrate for wire bonded semiconductor dice in a conventional molding process. The leadframe is placed inside a mold tool and individual package bodies are molded around each semiconductor die. The package body is substantially symmetrical around the leadframe and the semiconductor die. In the overmolding process, the package body is only formed on one side of the substrate. The finished product looks substantially the same as the multi-package module 10 of FIG. 1. After molding, the semiconductor multi-package module can be tested and burned-in as a module. If all components of the module are functional, then the multi-package module can be shipped to the customer for his application.

Figure 3:
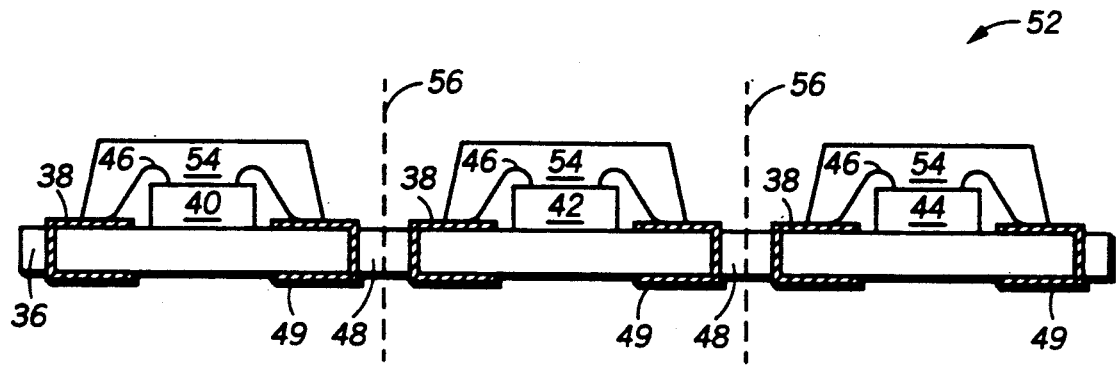
FIG. 3 is a cross-sectional view of a multi-package module outlining a device replacement region for a non-functional semiconductor device, in accordance with a repair method of the invention.

Also in accordance with the invention, a method of repairing a faulty semiconductor multi-package module is provided. Illustrated in FIG. 3 is a cross-section of a semiconductor multi-package module 52, which is a post-molded version of the PC board material substrate assembly 32 of FIG. 2. Semiconductor dice 40, 42, and 44 are protected with a plurality of individual package bodies 54. Dotted lines 56 correspond to a device replacement region around any non-functional semiconductor device. To repair a faulty semiconductor multi-package module, in the case of the failure being due to a die failure, the non-functional semiconductor device needs to be removed from the module. The removal of the non-functioning device can be accomplished by either a mechanical method or by a laser scribing technique. For this illustration, semiconductor die 42 is hypothetically non-functional, although it should be obvious that the following discussed method of repair is applicable to any non-functional semiconductor die of the multi-package module regardless of location on the PC board material substrate.

Figure 4:
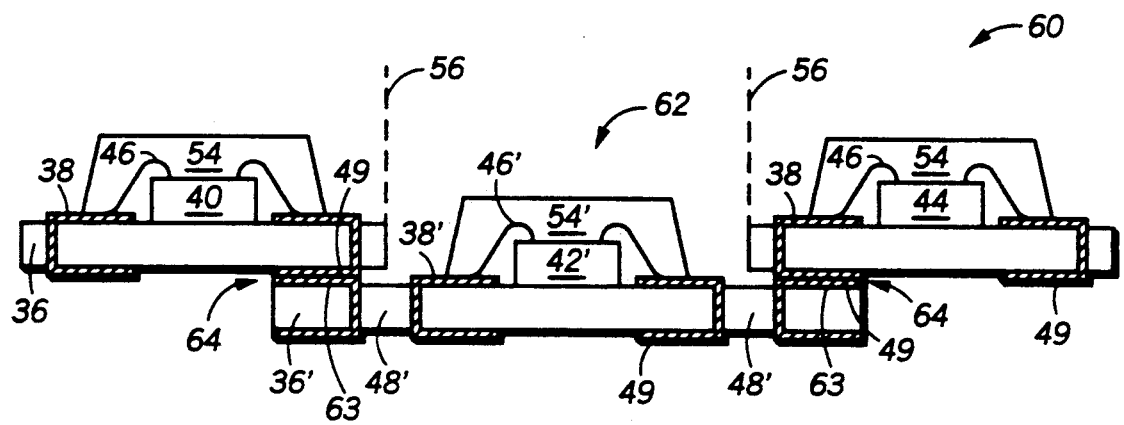
FIG. 4 is a cross-sectional view of a multi-package module with a replacement semiconductor device, illustrating a method of repair in accordance with the invention.

Illustrated in FIG. 4 is a cross-sectional view of a repaired semiconductor multi-package module 60. The replacement section 62 consists of a semiconductor die 42' with wire bonds 46' and an overmolded package body 54' directly mounted on a second PC board material substrate 36' having through-hole vias 48' and circuit traces 38'. Semiconductor die 42' performs the same functions as that of the removed non-functional die. Replacement section 62 is essentially a punch-out from another semiconductor multi-package that has been manufactured using the method discussed previously. However, a replacement section having a semiconductor die that is encapsulated with a glob top instead of being overmolded with a molding compound can also be used for the repair of the module. It should be noted that replacement section 62 is larger than device replacement region 56. The overlap of the first PC board material substrate 36 and the second PC board material substrate 36' allows the repair of the multi-package module to be effected. The backside metallization 49 of circuit traces 38 is soldered to the top side metallization 63 of circuit traces 38' thereby physically and electrically connecting the replacement section 62 to the original module.

Figure 5:
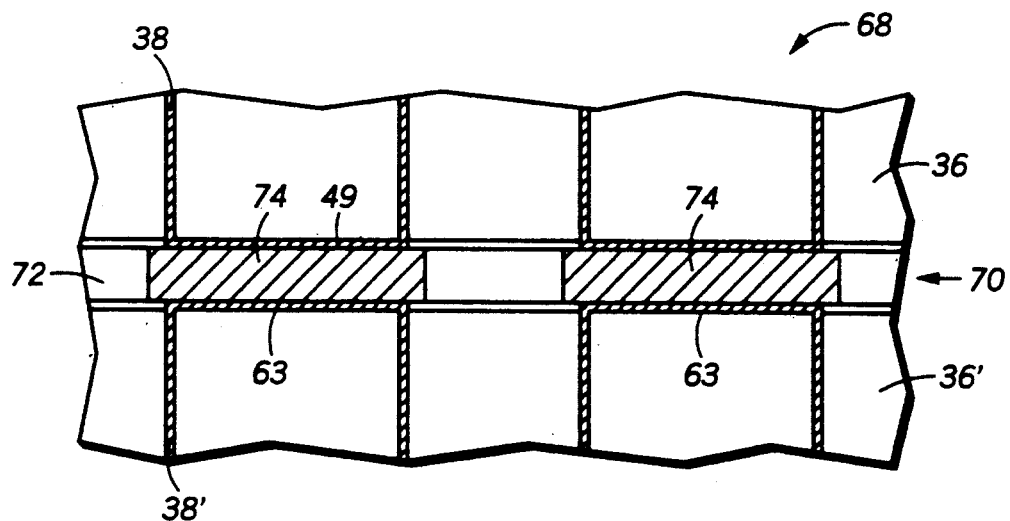
FIG. 5 is a partial enlarged cross-sectional view of a jumper tape solder connection, illustrating a method of repairing the multi-package module in accordance with the invention.

Several methods can be used to make solder joints 64. One method is to directly solder the metal traces together using solder paste or a solder bump technique. A solder resistance mask can be used to form suitable solder joints and stand-off height. Illustrated in FIG. 5 is another method to make solder joints 64 of FIG. 4, using a fine-pitched solder tape as a jumper tape to make the connections. Shown in FIG. 5 is a partial enlarged cross-sectional view of a jumper tape connection 68. With this method, a solder strip 70 consisting of a tape 72 having a plurality of solder traces 74 is laid perpendicular to the circuit traces 38 and 38' between the two PC board material substrates 36 and 36'. The solder traces 74 are available in varying standard pitches to match different circuit trace pitches. As the solder strip 70 is heated, the solder traces 74 wet only to the backside metallization 49 of circuit traces 38 and to the top side metallization 63 of circuit traces 38' because of surface tension, thus leaving gaps between the circuit traces 38 and 38' so that no shorting occurs between the circuit traces. An alternative to using a fine-pitched solder tape is to use a tape having continuous solder, although the fine-pitched solder tape allows more precise control of the solder during the reflow process. The first method discussed is more cost effective and more likely to be used in assembly than the second method discussed, although both are viable options for repairing the multi-package module of the present invention.

The advantage to the invention's method of manufacturing a multi-package module is that test and burn-in are performed at the module level. Additionally, the semiconductor devices are already mounted onto a board, thereby eliminating the need for board mounting at the customer site. This offers an additional advantage in that package cracking can be avoided. Plastic packages typically absorb moisture from the environment. Then during the rapid heating associated with the solder reflow process during board mounting, the moisture vaporizes inside the package causing the plastic package body to crack. The direct overmolding of each device on the substrate eliminates the risk of package cracking during the board mounting process. Furthermore, no shipping tray or shipping rail is needed because there are no package leads to protect. The multi-package modules can be shipped stacked on top of one another without risk of damage because the PC board material substrate is sturdy. Additionally, the individualized package body around each semiconductor die on the PC board material substrate reduces the risk of board warpage as opposed to a multiple chip module with a single package body for all the semiconductor dice.

The foregoing description and illustrations contained herein demonstrate many of the advantages associated with the present invention. In particular, it has been revealed that semiconductor dice can be directly mounted onto a PC board material substrate with edge connectors, thus eliminating the need for flimsy leadframes. Consequently, no special handling is required to eliminate leadframe damage. Moreover, no lead finishing process steps such as plating and lead trim and form are required with the present invention. Yet another advantage is that the present invention eliminates the customer's need for fine pitch board mounting process equipment because the multi-package module is already on a board. By using the edge connectors, the customer simply has to plug the module into the appropriate socket on his equipment.

Thus it is apparent that there has been provided, in accordance with the invention, a semiconductor multi-package module that fully meets the need and advantages set forth previously. Although the invention has been described and illustrate with reference to specific embodiments thereof, it is not intended that the invention be limited to these illustrative embodiments. Those skilled in the art will recognize that modifications and variations can be made without departing from the spirit of the invention. For example, the FIGURES illustrate a PC board material substrate in a strip form, but it should be apparent that a substrate in sheet form serves the same function. In addition, the invention is not limited to overmolded semiconductor devices since another type of device, such as a TAB unit, can be used as the replacement device in the repair of the module. It is also important to note that the present invention is not limited in any way to SIMMs or memory type modules, but can be applied to any multiple chip modules. Furthermore, it should be obvious that although the invention discloses a method for making a multi-package module, individual devices can be manufactured using the same process steps for the module and then singulated after test and burn-in. Therefore, it is intended that this invention encompass all such variations and modifications as fall within the scope of the appended claims.

We claim:

1. A semiconductor multi-package module comprising:

a first printed circuit (PC) board material substrate having a plurality of conductive paths including bonding pads and a plurality of electrical edge connectors along one edge of the first PC board material substrate;

a plurality of semiconductor dice directly mounted to the first PC board material substrate, the plurality of semiconductor dice being electrically connected to the bonding pads of the plurality of conductive paths by a plurality of wire bonds;

an encapsulating material overmolding the plurality of semiconductor dice including at least the plurality of wire bonds on the first PC board material substrate, wherein the encapsulating material is dispensed directly on and adheres to the PC board material substrate to form an individualized package body for each of the plurality of semiconductor dice; and a second PC board material substrate having a plurality of conductive paths and a semiconductor die mounted, electrically coupled, and encapsulated thereon, the first PC board material substrate further having a plurality of through-hole vias and backside metallization, wherein the second PC board material substrate is physically and electrically connected to the first PC board material substrate by a plurality of solder joints connecting the plurality of conductive paths of the second PC board material substrate with the backside metallization of the first PC board material substrate.

2. The semiconductor multi-package module according to claim 1 wherein the semiconductor die mounted, electrically coupled, and encapsulated on the second PC board material substrate is overmolded thereon.

3. A semiconductor multi-package module comprising:
- a first PC board material substrate having a plurality of conductive paths including bonding pads and a plurality of electrical edge connectors;
- a plurality of semiconductor dice directly mounted to the first PC board material substrate, the plurality of semiconductor dice being electrically connected to the bonding pads of the plurality of conductive paths;
- an encapsulating material overmolding the plurality of semiconductor dice on the first PC board material substrate, wherein the encapsulating material adheres to the PC board material substrate and forms an individualized package body for each of the plurality of semiconductor dice; and
- a repair section having a semiconductor die mounted and electrically coupled to a second PC board material substrate having conductive paths, the repair section being physically and electrically connected to the first PC board material substrate with a fine pitched solder tape, to electrically connect the semiconductor die on the second PC board material substrate to the plurality of conductive paths on the first PC board material substrate.

4. The semiconductor multi-package module according to claim 3 wherein the semiconductor die mounted and electrically coupled to the second PC board material substrate having conductive paths is overmolded thereon.

5. The semiconductor multi-package module according to claim 3 wherein the semiconductor die mounted and electrically coupled to the second PC board material substrate having conductive path is encapsulated thereon with a glob top.

* * * * *